(12) United States Patent
Theodoras

(10) Patent No.: US 6,697,397 B2
(45) Date of Patent: Feb. 24, 2004

(54) WAVELENGTH COMPENSATED ALC LOOP

(75) Inventor: James Thomas Theodoras, Plano, TX (US)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/987,750

(22) Filed: Nov. 15, 2001

(65) Prior Publication Data

US 2003/0091074 A1 May 15, 2003

(51) Int. Cl.[7] ................................................ H01S 3/13
(52) U.S. Cl. ................................. 372/29.02; 372/32
(58) Field of Search ........................ 372/29.011, 20, 372/32; 359/287, 194

(56) References Cited

U.S. PATENT DOCUMENTS

| | | | | |
|---|---|---|---|---|
| 4,698,817 A | * | 10/1987 | Burley | 372/31 |
| 5,253,267 A | * | 10/1993 | Johnson | 372/38.01 |
| 5,371,473 A | | 12/1994 | Trinh et al. | |
| 5,376,880 A | | 12/1994 | Nardozza | |
| 5,398,006 A | | 3/1995 | Guntzburger et al. | |
| 5,822,112 A | * | 10/1998 | Itou et al. | 359/194 |
| 5,870,217 A | * | 2/1999 | Itou et al. | 359/179 |
| 5,966,237 A | | 10/1999 | Sugaya et al. | |
| 6,005,995 A | | 12/1999 | Chen et al. | |
| 6,097,743 A | * | 8/2000 | Alphonse | 372/32 |
| 6,185,233 B1 | * | 2/2001 | Moothart et al. | 372/29.011 |
| 6,198,757 B1 | | 3/2001 | Broutin et al. | |
| 6,229,832 B1 | * | 5/2001 | Baba et al. | 372/29.011 |
| 6,236,667 B1 | | 5/2001 | Broutin et al. | |
| 6,289,028 B1 | * | 9/2001 | Munks et al. | 372/20 |
| 6,327,036 B1 | * | 12/2001 | Bao et al. | 356/480 |
| 6,369,926 B1 | * | 4/2002 | Lyu et al. | 359/187 |
| 6,400,737 B1 | * | 6/2002 | Broutin et al. | 372/20 |

* cited by examiner

*Primary Examiner*—Paul Ip
*Assistant Examiner*—Hung T Vy
(74) *Attorney, Agent, or Firm*—Sughrue, Mion, Zinn, MacPeak & Seas, PLLC; Jessica W. Smith; V. Lawrence Sewell

(57) ABSTRACT

The present invention comprises a dense wavelength division multiplexing system which uses an automatic level control feedback circuit or loop (100) to maintain one of a plurality of selectable output power levels. In addition, to prevent the sidelobes of the individual channels from interfering with one another when power to the channel is increased, an optical bandpass filter (5) is placed in the optical feedback path of the ALC loop (100). Furthermore, if the frequency or wavelength drifts from the desired output wavelength, the output wavelength is tuned by cooling or heating the laser using a thermoelectric cooler (55) which is part of a thermoelectric cooler loop (110) that uses a calibration table to adjust for temperature/wavelength errors.

33 Claims, 6 Drawing Sheets

CALIBRATION TABLE

| DESIRED AGGREGATE POWER | PROVISIONAL VOLTAGE FROM DAC | RESULTING LASER DIODE CURRENT | RESULTING CALIBRATION VOLTAGE FROM μP/DAC TO COVER WAVELENGTH |
|---|---|---|---|
| -30 dBm | 0.010 V | 15.297 mA | -3.1834 V |
| -20 dBm | 0.100 V | 15.843 mA | -3.1835 V |
| -10 dBm | 1.000 V | 21.074 mA | -3.1722 V |
| 0 dBm | 10.000 V | 73.308 mA | -2.9549 V |

FIG. 3

WAVELENGTH COMPENSATED ALC LOOP

FIELD OF INVENTION

This invention is related to the field of wavelength division multiplexing. More specifically, it relates to using an automatic level control loop (ALC) in a dense wavelength division multiplexing (DWDM) system.

BACKGROUND OF INVENTION

Wavelength division multiplexing (WDM) is a method of increasing the information capacity of a fiber optic system. Instead of using just one optical information source transmitting over one narrow spectral width, WDM takes advantage of the full transmission capability of an optical fiber by simultaneously transmitting signals from a plurality of optical information sources over different channels on the same optical fiber. The sources transmit information over different peak wavelengths which are spaced far enough apart so as to avoid interference between adjacent signal sources. Transmitting information in this manner utilizes the full bandwidth of the fiber.

Light generating sources are used as transmitters in optical systems (along with a modulator and an information source). A WDM system can use a plurality of fixed frequency light sources or one tunable laser source.

One way to tune lasers is by varying the wavelength or, equivalently, the laser frequency. At the same time, it is preferable to minimize other undesirable or unwanted effects. However, this is not always possible. For example, when tuning a currently available distributed feedback (DFB) laser, it may not be possible to vary the wavelength without causing other undesirable effects. In addition, with dense wavelength division multiplexing (DWDM) applications, optical frequency or wavelength stabilization of lasers may be needed. Etalons are an example of a stable optical filter used for wavelength stabilization.

Since the laser wavelength is a function of temperature, lasers can be tuned with temperature. Unfortunately, other parameters, such as optical power output, also change when tuning using temperature. An optical power control system may then be used to control the optical power. This generally does not present a major problem since this feature is found in many laser systems. For example, in U.S. Pat. No. 6,236,667 the wavelength control system feeds a control current or control voltage to a control terminal which changes the laser wavelength. A thermoelectric cooler (TEC) coupled to the wavelength control system receives this control signal and responds thereto by changing the temperature of the laser and thereby the wavelength. U.S. Pat. No. 6,236,667 is hereby incorporated by reference.

Typically, when transmitting data in a channel, unwanted or undesired frequencies are transmitted along with the desired signal. These signals take the form of sidelobes which are only 30 dB below the signal peak. These sidelobes can leak into other channels, thereby corrupting the signals in the other channels.

Generally, data channels work over a very narrow dynamic range and don't require much power. Therefore, crosstalk from sidelobes is usually not a problem. However, a dense wavelength multiplexing (DWDM) system comprising an automatic level control (ALC) loop contains many channels. ALC loops require significantly more power to compensate for all the channels. This additional power results in even higher sidelobes (or sidelobes containing more power) than a typical data channel. As a result, the signals from these unwanted sidelobes leak into other channels.

An optical bandpass filter can be used to reduce the sidelobes. However, introduction of a bandpass filter can produce nonlinearities in an ALC loop. Wavelength lockers are currently used to control nonlinearities in ALC control loops. However, they are very complicated and only work over a narrow dB dynamic range. Consequently, wavelength lockers may not work within ALC control loops having large dB dynamic ranges.

SUMMARY OF THE INVENTION

The present invention is an automatic level control loop comprising an automatic level control circuit comprising a controller, a filter operably connected in feedback with the automatic level control circuit and a thermoelectric cooler loop operably connected to the automatic level control circuit.

In another preferred embodiment, the automatic level control circuit further comprises an amplifier operably connected between said photodiode and a second input of an error amplifier, an integrator connected in between the output of said first error amplifier and the laser diode, the laser driver connected in between the output of the error amplifier and the laser diode, and a first digital-to-analog converter operably connected between the input of the first error amplifier and the output of the controller.

In still another preferred embodiment, the thermoelectric cooler loop further comprises a thermoelectric cooler driver operably connected in series with the integrator, wherein the thermoelectric cooler driver and the integrator are operably connected between the output of the second error amplifier and the thermoelectric cooler, a second digital-to-analog converter operably connected between a first input of the second error amplifier and a second output of the controller; and an amplifier operably connected between the thermistor and the second input of the second error amplifier.

In still another preferred embodiment, the present invention is a method of maintaining an output power level using an automatic level control loop, comprising the steps of providing a desired power level by outputting a reference signal. Next, a portion of the a laser diode's output power is fed back, filtered and converted to a feedback voltage. Next, the fed back portion of filtered output power is subtracted from the reference voltage, thereby producing a difference signal. This difference signal is used to drive the laser diode.

In still another preferred embodiment, the present invention is a method of stabilizing output frequency using a thermoelectric loop, comprising the steps of monitoring a laser diode's output power and determining whether said laser diode's output frequency has drifted. To tune the laser diode, the following steps are performed. A digital value is read from a calibration table, a desired output wavelength is provided by outputting a control signal, a temperature of a thermoelectric cooler is sensed and converted to a feedback signal. Next, the feedback signal is subtracted from the control signal producing a difference signal. This difference signal is used to drive a thermoelectric cooler, which in turn, changes a temperature of the laser diode.

BRIEF DESCRIPTION OF THE DRAWINGS

FIG. 3 is an example of the calibration table used in the present invention.

DETAILED DESCRIPTION OF THE INVENTION

Figure 1:
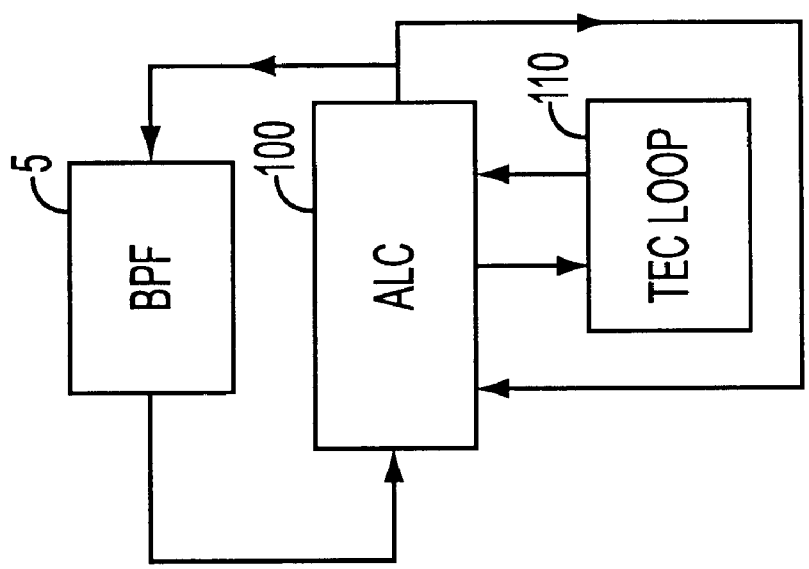
FIG. 1 is a top-level block diagram of the present invention showing the ALC loop, the feedback filter and the thermoelectric control loop.
Figure 2:
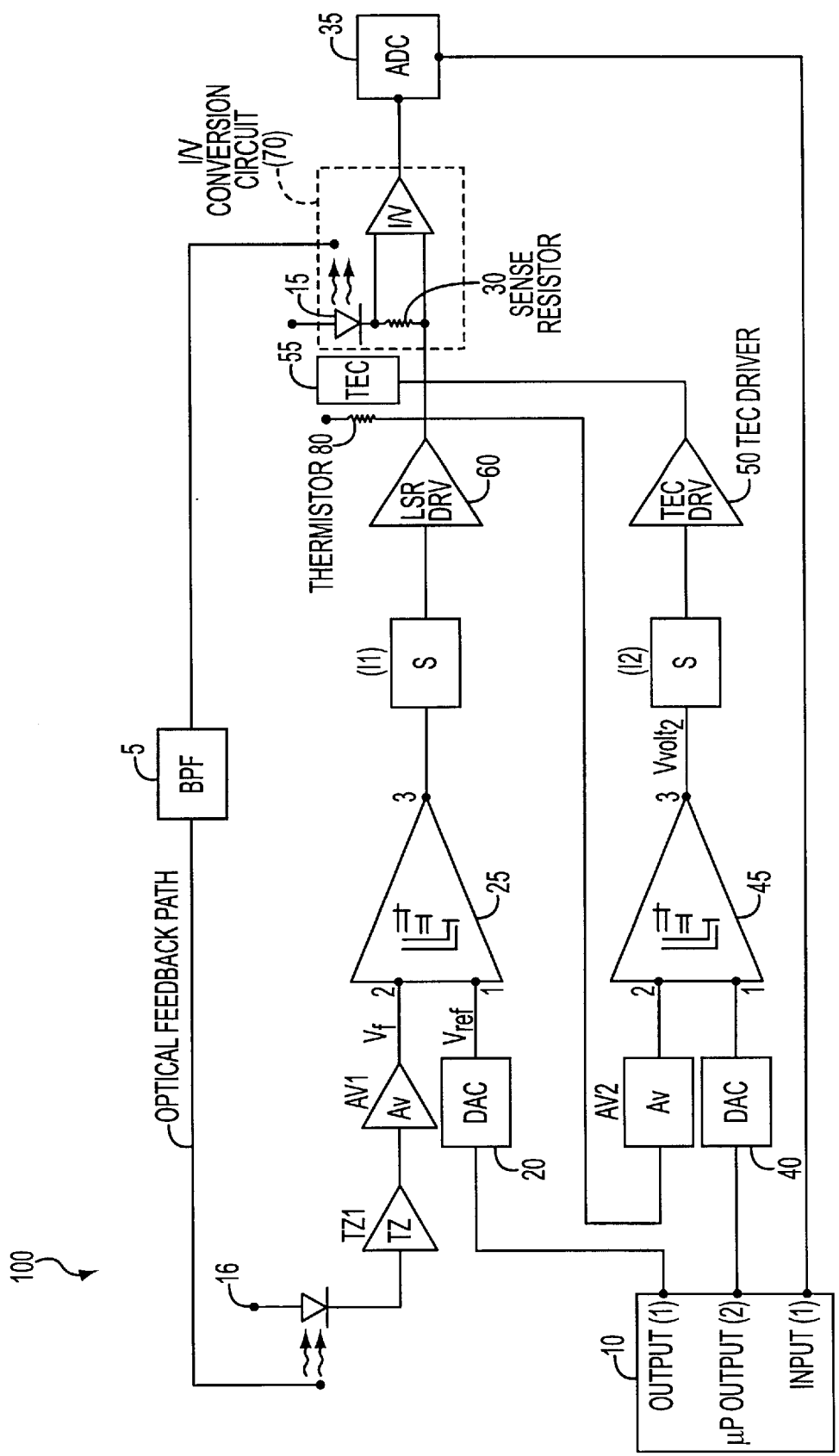
FIG. 2 is a block diagram of the present invention showing features of the ALC loop and the thermoelectric control loop.

The present invention has a plurality of features. First, to prevent the sidelobes of the individual channels of an ALC loop from interfering with one another when power to the channel is increased, an optical bandpass filter (5) is placed in the optical feedback path of the ALC loop (100) (see FIGS. 1 and 2). As discussed above, power levels of sidelobes in individual channels can be as high as 30 dBc or 30 dB below the peak level of the data signal. Use of an optical bandpass filter (5) can reduce the sidelobes by another 30 to 50 dB, depending on how many stages of filtering are used. This allows greater power levels to be used in the data channels. In a preferred embodiment, a thin film filter is used as the bandpass filter (5). Other optical filters, such as etalons and arrayed waveguide gradient (AWG) filters can also be used.

However, the ALC is a linear control loop. By placing the optical bandpass filter into the ALC control loop, a nonlinearity is introduced into the linear control loop. Although the bandpass filter is linear within its passband, outside its passband it becomes nonlinear. As the laser's wavelength increases with drive current, the laser's wavelength begins to approach the edge of the filter's passband. This causes the optical feedback path to become non-linear which, in turn, can cause the loop to become unstable. As a result, the loop can latch-up, or put another way rail out, and stop functioning.

A second preferred embodiment of the present invention is to improve the stability of the system. A thermoelectric cooler (TEC) (55) is used to tune a laser diode (15). It sets the temperature of the laser diode (15), thereby setting the laser diode's (15) output frequency. However, as current is used to drive the laser diode (15), localized heating occurs within the laser diode (15). This produces a gradient causing the output frequency of the laser diode (15) to vary from the desired output frequency or wavelength set by the TEC (55). To keep the wavelength of the laser diode centered, the wavelength compensated ALC loop (100) utilizes a software provisional thermoelectric control loop (110). A microprocessor (10) and a calibration table (200) stored on the microprocessor (10) are used in conjunction with a thermoelectric cooler loop (110) to actively hold the wavelength of the laser. As a result, the ALC loop (100) maintains its stability. The microprocessor or controller (10) and calibration table (200) are used to regulate the software provisional TEC loop (110). The software provisional TEC loop (110) may receive information from the calibration table (200) (see FIG. 3) or from user supplied information which the user inputs into the microprocessor (10) through software. In a preferred embodiment, the software provisional loop TEC loop (110) receives information from the calibration table (200).

Loop Output Power Control Using ALC

Figure 4:
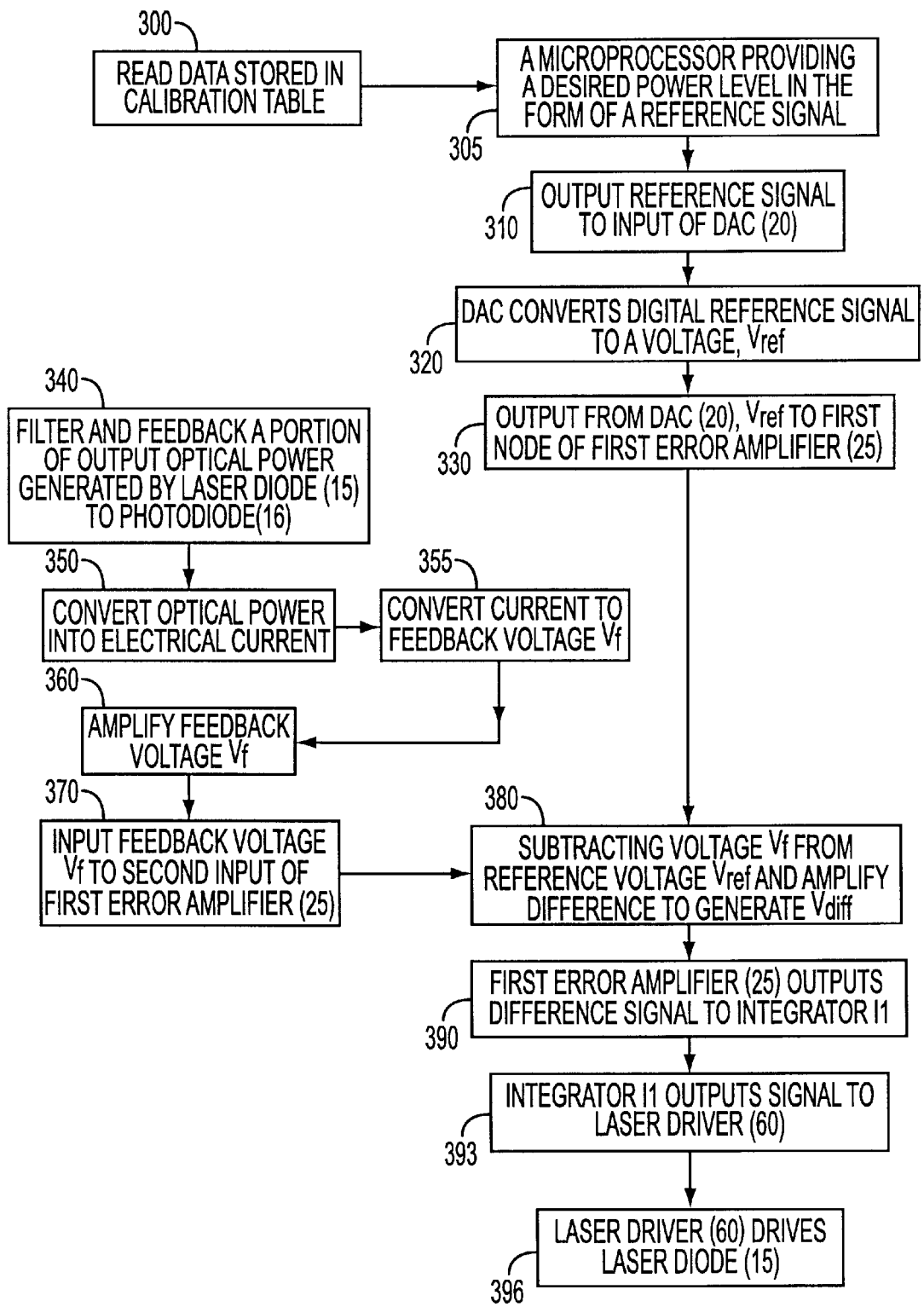
FIG. 4 is a flowchart of the steps taken to maintain output power.

In a third preferred embodiment, an automatic level control feedback circuit or loop (100) is used to maintain one of a plurality of selectable output power levels. 0 dBm is selected as a typical desired output power level. In the present example, the power in the wavelength compensated ALC loop (100) is increased. Data stored in calibration table (200) is read (Step 300) (see FIG. 4). According to calibration table (200) (see calibration table in FIG. 3), a laser diode (15) current of 73.308 mA corresponds to an aggregate power from the laser diode (15) of 0 dBm. Therefore, for the voltage on node 2 to reach 10 Volts, the power is increased so that 73.308 mA is passing through the laser diode (15).

To do this, the microprocessor (10) provides the wavelength compensated ALC loop (100) with a desired power level, measured in dBm, in the form of a reference signal (Step 305). Therefore, one of the functions of the microprocessor (10) is to act as an automatic loop reference generating circuit.

The microprocessor (10) outputs the reference signal in binary (or digital) form (on output (1)) to the input of a first digital-to-analog converter (DAC) (20) (Step 310). The first DAC (20) converts the digital reference signal to a voltage ($V_{ref}$) (Step 320). For a 0 dBm desired output level, this voltage would correspond to 10 Volts (see calibration table (200) in FIG. 2). The output from the first DAC (20) is input to a first node (1) of a first error amplifier or comparator (25) (Step 330). The output of the first DAC (20) serves as an analog reference signal or voltage reference signal ($V_{ref}$).

The second node (2) of a first error amplifier (25) is connected to a photo diode (16). The photo diode (16) is connected to laser diode (15) through the feedback path containing optical bandpass filter (5). The feedback path is an optical feedback path. A portion of the output optical power generated by laser diode (15) is coupled or fed back to the photo diode (16) (Step 340). The photo diode (16) converts the optical power to an electrical current (Step 350). This electrical current is fed to a transimpedance amplifier (TZ1) which converts the current into a voltage (Step 355). The feedback voltage ($V_f$) is then amplified by amplifier ($A_{V1}$) (Step 360). The feedback voltage ($V_f$) acts as a feedback signal and is input to the second node (2) of the first error amplifier (25) (Step 370). The voltage ($V_f$) is related to the output power of the laser diode (15).

The first error amplifier (25) receives the reference signal ($V_{ref}$) on node 1 and the feedback signal ($V_f$) on node 2 and generates a difference signal ($V_{diff}$) on node 3. The first error amplifier (25) generates the difference signal ($V_{diff}$) by subtracting the feedback signal ($V_f$) from the reference signal ($V_{ref}$) and amplifying the difference (Step 380). This output signal ($V_{diff}$) is indicative of the difference in power between the signal output by laser diode (15) and the desired output power.

The loop attempts to push the voltage ($V_f$) on the second node (2) of the first error amplifier (25) to equal the reference voltage ($V_{ref}$) on the first node (1). The first error amplifier (25) outputs the difference signal to an integrator (I1) (Step 390). (In a preferred embodiment, integrator I1 comprises an operational amplifier with a capacitor in its feedback loop). I1 outputs a signal to a laser driver (60) (Step 393). The laser driver (60) drives 73.308 mA though laser diode (15) (step 396). This causes the laser diode (15) to output more power.

Loop Stability

Figure 5A:
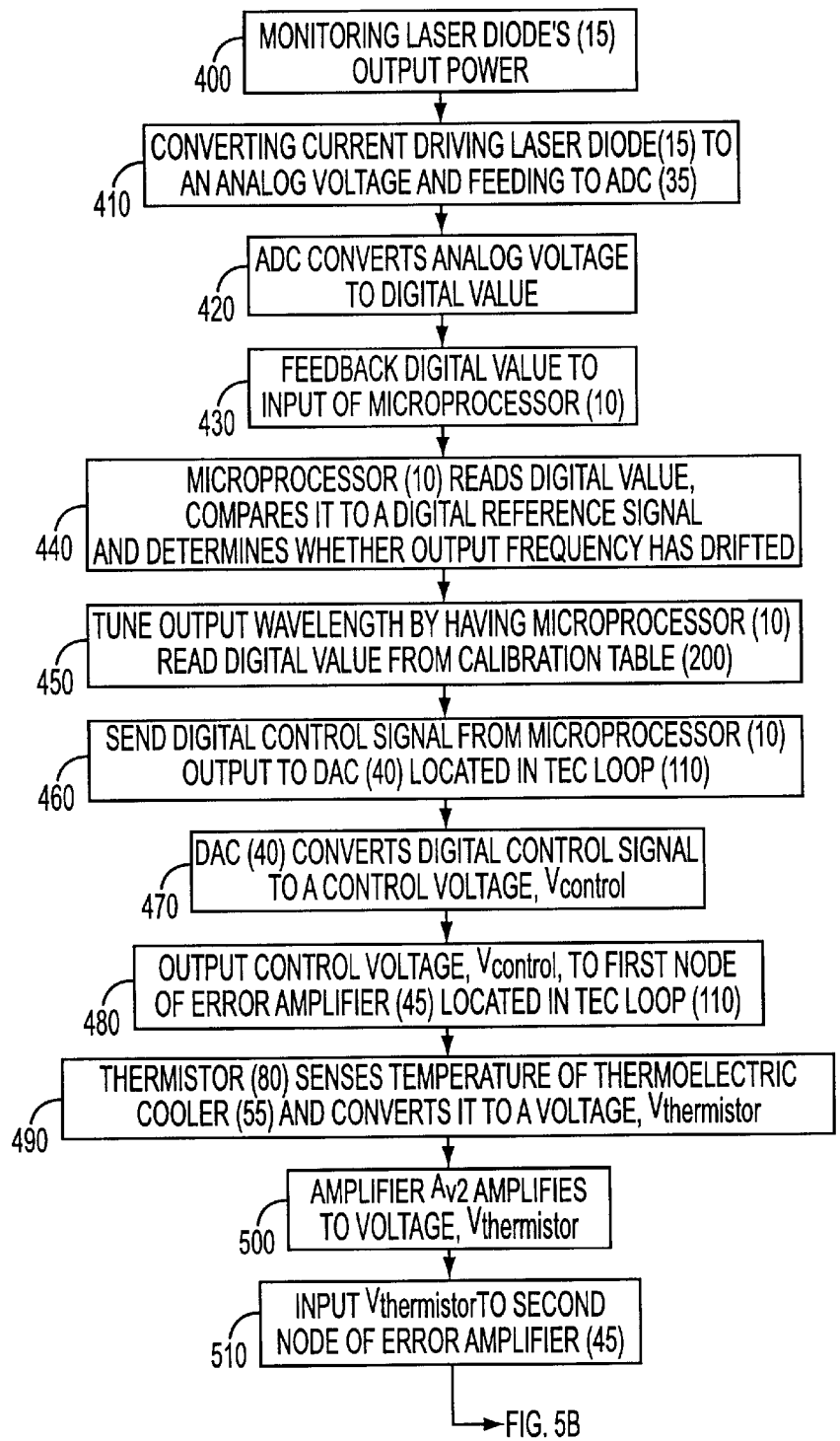
FIGS. 5A and 5B are a flowchart of the steps taken to maintain output wavelength stability.
Figure 5B:
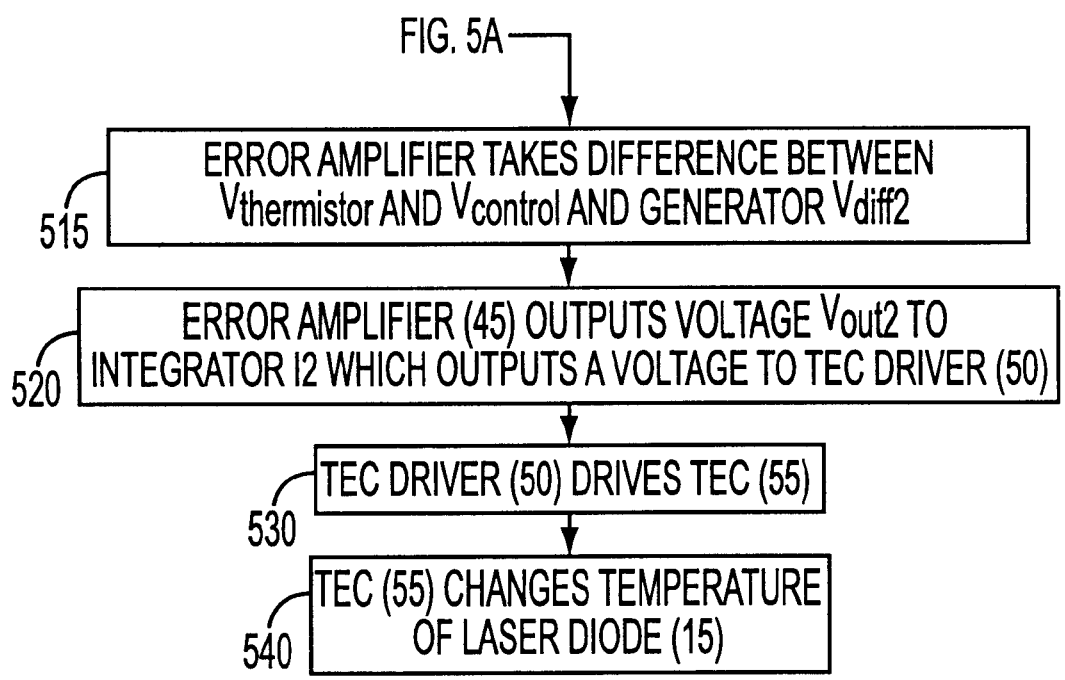

The power output from laser diode (15) will change if its output frequency or wavelength drifts from the desired output wavelength. If the output frequency drifts to the edges of the feedback filter Therefore, the laser diode's output power is monitored to determine whether its output frequency has drifted (Step 400) (see FIGS. 5A and 5B). The current driving laser diode (15) flows through sense resistor (30). The sense resistor (30) (which is part of I/V conversion circuit (70)) converts the current to an analog voltage which is fed to an analog-to-digital converter (ADC) (35) (Step 410). The ADC (35) converts this analog voltage to a binary value (or digital value) (Step 420) which is fed back to input (1) on the microprocessor (10) (Step 430). The microprocessor (10) reads this binary value and compares it to the digital reference signal (Step 440). If the binary value is not equivalent to the desired output voltage (or reference signal), which in this example is 10 Volts, then the loop has drifted from the desired output wavelength.

However, the output frequency or wavelength of the laser diode (15) can be tuned by cooling or heating the laser using a thermoelectric cooler (TEC) (55) which is part of the TEC loop (110). To accomplish this it provides a desired wavelength by outputting a control signal. The microprocessor (10) reads a binary or digital value from calibration table (200) (Step 450). Next, it sends a control signal from microprocessor output (2) in the form of a binary or digital value to a second DAC (40) located in a thermoelectric cooler (TEC) loop (110) (Step 460). In this respect, the microprocessor is functioning as an automatic loop controller since it controls the wavelength of a laser diode by generating a control signal on the basis of the current flowing through the laser diode (15). The second DAC (40) converts the digital control signal to a control voltage ($V_{control}$) (Step 470). (In the above example, this voltage is 2.9549 Volts (see calibration table (200) of FIG. 2).

This control voltage ($V_{control}$) is input to the first node of a second error amplifier (45) also located in the thermoelectric cooler loop (110) (Step 480). The second node of the second error amplifier (45), or comparator, is connected to a thermistor (80) which is part of the thermoelectric cooler loop (110). The resistance of the thermistor (80) varies with temperature. Consequently, the thermistor (80) will sense the temperature of a thermoelectric cooler TEC (55) and convert it to a voltage (Step 490). The thermistor (80) can have either a negative or a positive thermal coefficient depending on the application. In the present example, it is negative. The voltage ($V_{thermistor}$) is an electrical feedback signal which is then amplified by amplifier $A_{V2}$ (also located in the TEC loop (110) (Step 500). The voltage ($V_{thermistor}$) is input to the second node (2) of the second error amplifier (45) (Step 510).

The second error amplifier (45) receives the control signal ($V_{control}$) on node 1 and the thermistor voltage signal, $V_{thermistor}$, on node 2 and takes the difference between the respective signals. It then generates an output signal ($V_{diff2}$) or second difference signal on node 3. The second error amplifier (45) generates the second difference signal ($V_{diff2}$) by subtracting the thermistor feedback signal ($V_{thermistor}$) from the control signal ($V_{control}$) (Step 515).

The loop attempts to push the voltage on the second node of the second error amplifier (45) to equal the voltage on its first node (1) (which in this case is 2.9549 Volts). The error amplifier (45) takes the difference voltage output ($V_{diff2}$) from the second error amplifier (45) and inputs it to integrator (I2). In turn, the integrator (I2) outputs a voltage to the input of a thermoelectric cooler driver (TEC driver) (50). This causes the current output from the TEC driver (50) to increase (Step 520). This in turn, drives the TEC (55) harder (Step 530) (both the TEC driver and the TEC are located in the thermoelectric cooler loop (110)). The TEC (55) receives this signal and responds thereto by changing (or in this case cooling) the temperature of the laser diode (15) (Step 540). The TEC (55) will cool the laser diode (15) so that the wavelength of the wavelength compensated ALC loop (100) is again centered.

While the invention has been disclosed in this patent application by reference to the details of preferred embodiments of the invention, it is to be understood that the disclosure is intended in an illustrative rather than in a limiting sense, as it is contemplated that modification will readily occur to those skilled in the art, within the spirit of the invention and the scope of the appended claims and their equivalents.

What is claimed is:

1. A wavelength compensated automatic level control loop, comprising:

an automatic level control circuit comprising a controller;

a bandpass filter operably connected in feedback with said automatic level control circuit to prevent crosstalk from sidelobes;

a thermoelectric cooler loop operably connected to said automatic level control circuit;

and wherein said automatic level control circuit further comprises:

an error amplifier having at least two inputs and an output, wherein a first of said inputs is operably connected to an output of said controller;

a laser diode operably connected between said on of said error amplifier and said bandpass filter;

a photodiode operably connected between said bandpass filter and a second input of said error amplifier;

a I/V conversion circuit operably connected between said laser diode and said output of said error amplifier; and an analog-to-digital converter operably connected between said I/V conversion circuit and an input of said controller.

2. The thermoelectric cooler loop according to claim 1, further comprising:

a thermistor operably connected to a second input of said error amplifier; and a thermoelectric cooler operably connected to said output of said error amplifier.

3. The wavelength compensated automatic level control loop according to claim 2, wherein said thermoelectric cooler loop further comprises a limiter connected in between said output of said error amplifier and said thermoelectric cooler.

4. The wavelength compensated automatic level control loop according to claim 2, wherein said thermoelectric cooler loop further comprises a thermoelectric cooler driver connected in between said output of said error amplifier and said thermoelectric cooler.

5. The wavelength compensated automatic level control loop according to claim 2, wherein said thermoelectric cooler loop further comprises a digital-to-analog converter operably connected between a first input of said error amplifier and said output of said controller.

6. The wavelength compensated automatic level control loop according to claim 2, wherein said thermoelectric cooler loop further comprises:

an amplifier operably connected between said thermistor and said second input of said error amplifier.

7. The wavelength compensated automatic level control loop according to claim 1, wherein said controller comprises a calibration table.

8. The wavelength compensated automatic level control loop according to claim 1, wherein said automatic level control circuit further comprises:
an amplifier operably connected between said photodiode and said second input of said error amplifier.

9. The wavelength compensated automatic level control loop according to claim 1, wherein automatic level control circuit further comprises a limiter connected in between said output of said error amplifier and said laser diode.

10. The wavelength compensated automatic level control loop according to claim 1, wherein said automatic level control circuit further comprises a laser driver connected in between said output of said error amplifier and said laser diode.

11. The wavelength compensated automatic level control loop according to claim 1, wherein said automatic level control circuit further comprises a first digital-to-analog converter operably connected between said first input of said error amplifier and said output of said controller.

12. The wavelength compensated automatic level control loop according to claim 11, wherein said thermoelectric cooler loop further comprises:
a thermoelectric cooler driver operably connected in series with said limiter, wherein said thermoelectric cooler driver and said limiter are operably connected between said output of said second error amplifier and said thermoelectric cooler;
a second digital-to-analog converter operably connected between a first input of said second error amplifier and a second output of said controller; and
an amplifier operably connected between said thermistor and said second input of said second error amplifier.

13. The method according to claim 1, wherein said wavelength compensated automatic level control loop is part of a dense wavelength division multiplexing system.

14. The wavelength compensated automatic level control loop according to claim 1, wherein said automatic level control circuit further comprises:
an amplifier operably connected between said photodiode and said second input of said error amplifier;
a limiter connected in between said output of said first error amplifier and said laser diode;
a laser driver connected in between said output of said error amplifier and said laser diode; and
a first digital-to-analog converter operably connected between said input of said first error amplifier and said output of said controller.

15. A wavelength compensated automatic level control loop, comprising:
an automatic level control circuit comprising a controller having at least one output, wherein said automatic level control circuit comprises:
a first error amplifier having at least two inputs and an output, wherein a first of said inputs is operably connected to a first output of said controller;
a laser diode operably connected between the output of said first error amplifier and said filter;
a photodiode operably connected between said filter and a second input of said first error amplifier;
a I/V conversion circuit operably connected between said laser diode and said output of said error amplifier; and
an analog-to-digital converter operably connected between said I/V conversion circuit and an input of said controller;
a filter operably connected in feedback with said automatic level control circuit, and
a thermoelectric cooler loop operably connected to said automatic level control circuit, wherein said thermoelectric cooler loop comprises:
a second error amplifier having at least two inputs and an output, wherein a first of said inputs is operably connected to a second output of said controller;
a thermistor operably connected to a second input of said second error amplifier; and
a thermoelectric cooler operably connected to said output of said second error amplifier.

16. The wavelength compensated automatic level control loop according to claim 15, wherein said controller comprises a calibration table.

17. The wavelength compensated automatic level control loop according to claim 16, wherein said automatic level control circuit further comprises:
an amplifier operably connected between said photodiode and said second input of said first error amplifier;
a limiter operably connected in series with a laser driver, wherein said limiter and said laser driver are operably connected in between said output of said first error amplifier and said laser diode; and
a first digital-to-analog converter operably connected between a first input of said first error amplifier and a first output of said controller.

18. The wavelength compensated automatic level control loop according to claim 17, wherein said thermoelectric cooler loop further comprises:
a limiter operably connected in series with a thermoelectric cooler driver, wherein said limiter and said thermoelectric cooler driver are operably connected between said output of said second error amplifier and said thermoelectric cooler;
a second digital-to-analog converter operably connected between a first input of said second error amplifier and a second output of said controller; and
an amplifier operably connected between said thermistor and said second input of said second error amplifier.

19. The wavelength compensated automatic level control loop according to claim 15, wherein said automatic level control circuit further comprises:
an amplifier operably connected between said photodiode and said second input of said first error amplifier.

20. The wavelength compensated automatic level control loop according to claim 15, wherein automatic level control circuit further comprises a limiter connected in between said output of said first error amplifier and said laser diode.

21. The wavelength compensated automatic level control loop according to claim 15, wherein said automatic level control circuit further comprises a laser driver connected in between said output of said first error amplifier and said laser diode.

22. The wavelength compensated automatic level control loop according to claim 15, wherein said automatic level control circuit further comprises a first digital-to-analog converter operably connected between a first input of said first error amplifier and a first output of said controller.

23. The wavelength compensated automatic level control loop according to claim 15, wherein said thermoelectric cooler loop further comprises a limiter connected in between said output of said second error amplifier and said thermoelectric cooler.

24. The wavelength compensated automatic level control loop according to claim 23, wherein said thermoelectric cooler loop further comprises:
a thermoelectric cooler driver operably connected in series with said limiter, wherein said thermoelectric cooler and said limiter are operably connected between said output of said second error amplifier and said thermoelectric cooler;

a second digital-to-analog converter operably connected between said first input of said second error amplifier and a second output of said controller; and an amplifier operably connected between said thermistor and said second input of said second error amplifier.

25. The wavelength compensated automatic level control loop according to claim 15, wherein said thermoelectric cooler loop further comprises a thermoelectric cooler driver connected in between said output of said second error amplifier and said thermoelectric cooler.

26. The wavelength compensated automatic level control loop according to claim 15, wherein said therrnoelectzit cooler loop further comprises a second digital-to-analog converter operably connected between a first input of said second error amplifier and a second output of said controller.

27. The wavelength compensated automatic level control loop according to claim 15, wherein said thermoelectric cooler loop further comprises:

an amplifier operably connected between said thermistor and said second input of said second error amplifier.

28. The method according to claim 15, wherein said wavelength compensated automatic level control loop is part of a dense wavelength division multiplexing system.

29. A method for stabilizing output frequency using a thermoelectric loop, comprising:

monitoring a laser diode's output power;

determining whether said laser diode's output frequency has drifted; and tuning said laser diode, comprising:
reading digital value from a calibration table;
providing a desired output wavelength by outputting a control signal;

sensing temperature of thermoelectric cooler;
converting said temperature to a feedback signal;
subtracting said feedback signal from said control signal producing a difference signal;
driving a thermoelectric cooler;
changing a temperature of said laser diode using said thermoelectric cooler; and
bandpass filtering a portion of output optical power generated by said laser diode to prevent crosstalk from sidelobes.

30. The method of stabilizing output frequency using thermoelectric loop according to claim 29, further comprising the step of maintaining an output power level using an automatic level control loop.

31. The method according to claim 30, wherein said thermoelectric loop is part of a dense wavelength division multiplexing system.

32. The method of stabilizing output frequency using a thermoelectric loop according to claim 30, wherein said step of maintaining an output power level using an automatic level control loop, further comprises the steps of:

providing a desired power level by outputting a reference signal;

feeding back a portion of output optical power generated by a laser diode;

converting said portion of output optical power to a feedback voltage;

subtracting said feedback portion from said reference voltage producing a difference signal; and driving said laser diode using said difference signal.

33. The method according to claim 32, wherein said thermoelectric loop is part of a dense wavelength division multiplexing system.

* * * * *